United States Patent [19]

Aton et al.

[11] Patent Number: 5,128,612
[45] Date of Patent: Jul. 7, 1992

[54] DISPOSABLE HIGH PERFORMANCE TEST HEAD

[75] Inventors: Thomas J. Aton; Rey M. Rincon, both of Dallas, Tex.

[73] Assignee: Texas Instruments Incorporated, Dallas, Tex.

[21] Appl. No.: 560,404

[22] Filed: Jul. 31, 1990

[51] Int. Cl.$^5$ .......................... G01R 1/00; G01R 1/04
[52] U.S. Cl. .................. 324/158 P; 324/72.5; 324/158 F
[58] Field of Search ............... 324/158 P, 158 F, 72.5

[56] References Cited

U.S. PATENT DOCUMENTS

| | | | |
|---|---|---|---|
| 4,473,798 | 9/1984 | Cedrone et al. | 324/158 P |
| 4,574,235 | 3/1986 | Kelly et al. | 324/158 P |
| 4,626,779 | 12/1986 | Boyle | 324/158 P |
| 4,733,172 | 3/1988 | Smolley | 324/158 P |
| 4,820,976 | 4/1989 | Brown | 324/158 P |
| 4,853,624 | 8/1989 | Rabjohn | 324/72.5 |
| 4,912,399 | 3/1990 | Greub et al. | 324/158 F |
| 4,950,981 | 8/1990 | Janko | 324/158 P |

OTHER PUBLICATIONS

"P6521 Very High Density High Performance Probe Card", by Tektronix, Inc., Copyrighted 1988.
"New Probe Cards Replace Needle Types", by Barsotti et al., Semiconductor International, Aug. 1988, pp. 98–101.
"A Coplanar Waveguide Primer", by Bachert, RF Design, Jul. 1988, pp. 52 and 54.

Primary Examiner—Kenneth A. Wieder
Assistant Examiner—William J. Burns
Attorney, Agent, or Firm—James C. Kesterson; B. Peter Barndt; Richard L. Donaldson

[57] ABSTRACT

A disposable integrated circuit test head (34) communicates a plurality of test signals between test nodes (20) of an integrated circuit and test circuitry. Disposable high-density test head (30) comprises signal platform (24) which includes tape layer (24) and interconnection lines (28). Interconnection lines (28) include signal leads (30) and bumps (32). Interconnection lines (28) coupled with test nodes (20) to electrically connect test nodes (20) with the test circuitry and communicate test signals between test nodes (20) and the test circuitry. Pusher block (36) engages signal platform (24) at tape layer (26) opposite interconnection lines (28) and applies force through tape layer (24) to interconnection lines (28). This allows positive engagement of interconnection lines (28) with test nodes (20). Pusher block (36) comprises rigid force applying plate (38) which adheres to compliant layer (40) at junction (42). Compliant layer (40) absorbs planarity differences between interconnection lines (28) and integrated circuit test nodes (20).

17 Claims, 4 Drawing Sheets

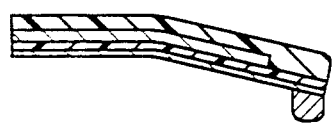
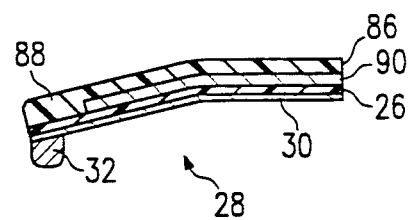
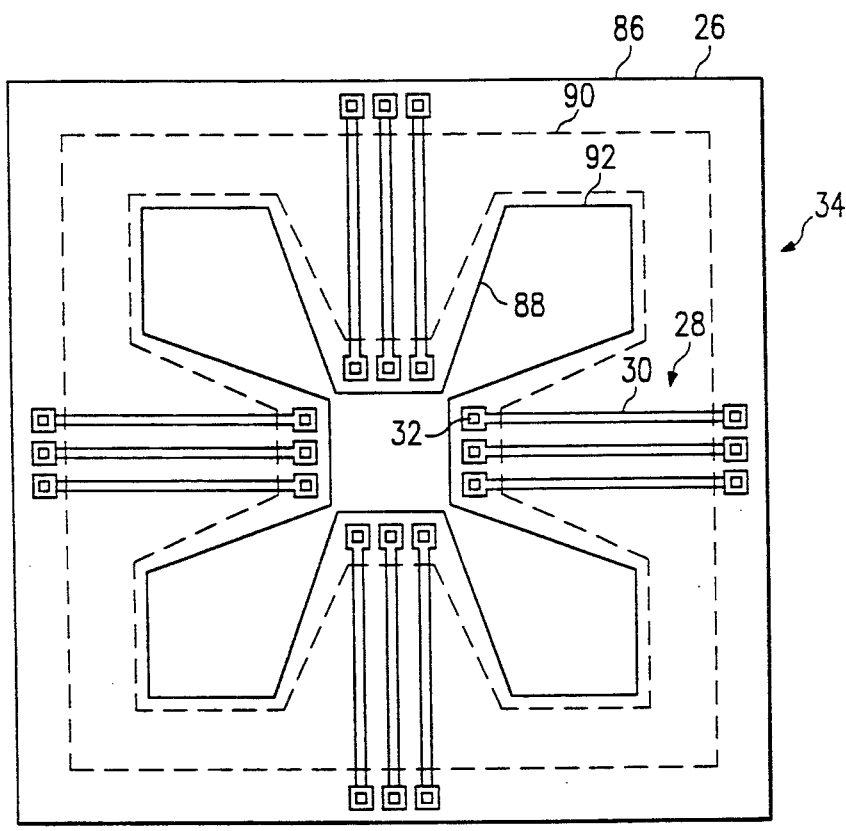

DISPOSABLE HIGH PERFORMANCE TEST HEAD

RELATED APPLICATIONS

The present invention relates to the invention disclosed and claimed in application Ser. No. 07/560,398, entitled "High Performance AC Test Head" by Kwon et al., which is assigned to Texas Instruments, Inc. of Dallas, Tex., filed contemporaneously herewith.

TECHNICAL FIELD OF THE INVENTION

The present invention relates in general to integrated circuit testing, and more particularly to a disposable high performance test head for testing integrated circuits.

BACKGROUND OF THE INVENTION

Both during and following fabrication, integrated circuit manufacturers test to determine that their integrated circuits satisfy design specifications. These tests typically involve the use of test probe cards that use test heads comprising a plurality of pins. The test pins are usually metal needles or blades that make electrical contact with test nodes or pads on the integrated circuits.

Conventional test heads that use metal needles or blades suffer from several limitations. First of all, conventional test head designers connect the metal needles to bonding wires on a printed circuit board by hand using manual alignment methods. This is a tedious process that makes conventional test probes extremely expensive. Also, conventional integrated circuit testing devices, because of their needle and wire bonding configurations have both size and complexity limitations. However, with today's integrated circuits increasing in size and complexity, the number of test nodes on an integrated circuit and, accordingly, the number of needles on test heads for testing these circuits must increase. The input and output speed of test signals through the test head, additionally, must increase.

With these requirements, conventional integrated circuit test probes have input/output limitations that are incompatible with or insufficient to meet the testing needs of new and more complex integrated circuits. Moreover, as the number of pins increase, their likelihood of being misaligned, bent, or shorted together increases, thereby shortening their functional lives.

The needles of conventional test heads also have significant physical length relative to their signal wave lengths. As a result, they suffer from capacitances and inductances that reduce input/output signal transmission speeds between the integrated circuits and the testing circuitry.

Today's testing systems are also becoming increasingly automated and complex. Automated prober systems for integrated circuits help to reduce operator intervention during the test process. New prober systems offer greater accuracy and longer life and improve productivity through features such as automatic wafer alignment and profiling. Some of the latest probers incorporate on-line systems which automatically evaluate and correct, if necessary, testing circuitry features such as contact impedance. The systems can accommodate even more complex test probe cards than are presently available.

In an attempt to solve the limitations inherent in conventional integrated circuit test heads, a thin film test probe is described in C. Barsotti et al., "New Probe Cards Replace Needle Types," Semiconductor International, p. 98 (Aug. 1, 1988). That device (the "Barsotti device") provides a high density and high performance test head that uses a metallic contact pad configuration to provide a more reliable test signal communication path and decrease parasitic capacitance and inductance in test signal transmission. The Barsotti device includes a test probe that comprises an elastomer base with a ground plane and polyimide layer covering the ground plane. The polyimide layer insulates the ground plane from the elastomer base. Strip lines cover the polyimide layer and connect to the metallic contact pads. The metallic contact pads engage test nodes on the integrated circuit to be tested.

Though the Barsotti device represents an improvement in integrated circuit testing technology, it still suffers from severe limitations. The Barsotti device increases the performance of integrated circuit testing, but at a significantly increased cost to the tester. Other limitations associated with the test probe include, first of all, that the elastomer base test probe requires the use of non-conventional fabrication techniques. Additionally, the polyimide and ground plane layers of the Barsotti device are bent to provide a protruded surface from which the metallic contact pads can extend. The protruded surface of the Barsotti device can cause signal degradation as it passes through the bent stress areas of the polyimide layer and ground plane.

Yet another limitation of known test probes is that in the event of a defect or misalignment of the needle pins of conventional test probes or a defect in the contact pads of the Barsotti device, the entire test probe must be discarded. If a device existed to permit rapid replacement of only the defective or damaged portion of the test head, manufacturers could realize significant savings during integrated circuit testing.

Consequently, there is a need for a low cost integrated circuit test head that provides high performance integrated circuit testing and which overcomes many of the limitations associated with test heads that use metal needles or blades.

Furthermore, a need exists for a disposable high performance test head for integrated circuits that permits removal of only the portion of the test head that may be damaged or defective.

SUMMARY OF THE INVENTION

According to one aspect of the invention, there is provided a disposable high performance test head that communicates a plurality of test signals between test nodes of an integrated circuit and test circuitry. The disposable high performance test head comprises a tape layer and a plurality of interconnection lines. The interconnection lines adhere to the tape layer and are associated to couple with test nodes to electrically connect the test nodes to the test circuitry. This permits the interconnection lines to communicate test signals between the test nodes and the test circuitry. A pusher block engages the tape layer opposite the side of the tape layer to which the interconnection lines attach and permits applying force through the tape layer to the interconnection lines. This allows positive engagement of the interconnection lines with the test nodes. The pusher block comprises a rigid force-applying plate and a compliant material layer. The compliant material layer is positioned between the force-applying plate and the tape layer. The compliant material layer absorbs planarity differences as the interconnection lines engage the test nodes.

Another aspect of the present invention includes a disposable high performance test head that communicates test signals between a plurality of integrated circuit test nodes and test circuitry. The disposable high performance test head comprises of tape layer to which adhere a plurality of interconnection lines. The interconnection lines comprise a plurality of signal leads and connection bumps. The connection bumps connect to the signal leads and permit positive engagement of the test nodes on the integrated circuits. The signal leads connect to the testing circuitry so that an electrical connection exists between the integrated circuit test nodes and the test circuitry. A pusher block engages the tape layer opposite the connection bumps and signal leads and permits applying positive pressure so as to engage the connection bumps with respective integrated circuit test nodes. The pusher block comprises a transparent rigid force applying plate and a transparent compliant material layer. Transparency of the pusher block permits precise alignment of the interconnection lines with the integrated circuit test nodes. The compliant material layer is disposed between the force applying plate and the tape layer to absorb planarity differences as the bumps engage the test nodes.

A technical advantage of the present invention is that it provides an integrated circuit test head that can easily communicate test signals between test circuitry and complex large scale integrated circuits.

As another technical advantage, the present invention provides the ability for integrated circuit test input and output data rates that far exceed conventional integrated circuit test probe input and output rates. Therefore the integrated circuit test head of the present invention can easily accommodate increases in the complexity of integrated circuit testing circuitry.

Yet another technical advantage of the present invention is that it provides a disposable high performance integrated circuit test head that is economical to produce.

A further technical advantage of the disposable high performance test head of the present invention is that it allows the use of automated fabrication techniques that eliminate the need for labor intensive test head design.

Another technical advantage of the present invention is that it provides a disposable high performance test head for which particular portions of the test head can be disposed of in the event of defects or damage without the need to dispose of the entire test head.

Yet another technical advantage of the present invention is that it can permit replacement of damaged or defective interconnection circuitry with a minimum of testing process interruption.

A further technical advantage of the present invention is that it provides a disposable high performance test head that can be manufactured economically and in large quantities.

BRIEF DESCRIPTION OF THE DRAWINGS

The invention, as well as modes of use and further advantages, is best understood by reference to the following description of illustrative embodiments when read in conjunction with the accompanying drawings.

FIG. 10 provides yet another alternative embodiment of the present invention providing spring-loaded pusher arms operating to provide spring force to positively engage interconnection lines with the integrated circuit test nodes; and FIG. 11 is a top planar schematic view of the alternative embodiment of FIG. 10.

DETAILED DESCRIPTION OF THE INVENTION

The preferred embodiment of the present invention is best understood by referring to the FIGS. 1-11 which use like numerals for like corresponding parts of the various drawings.

Figure 1:
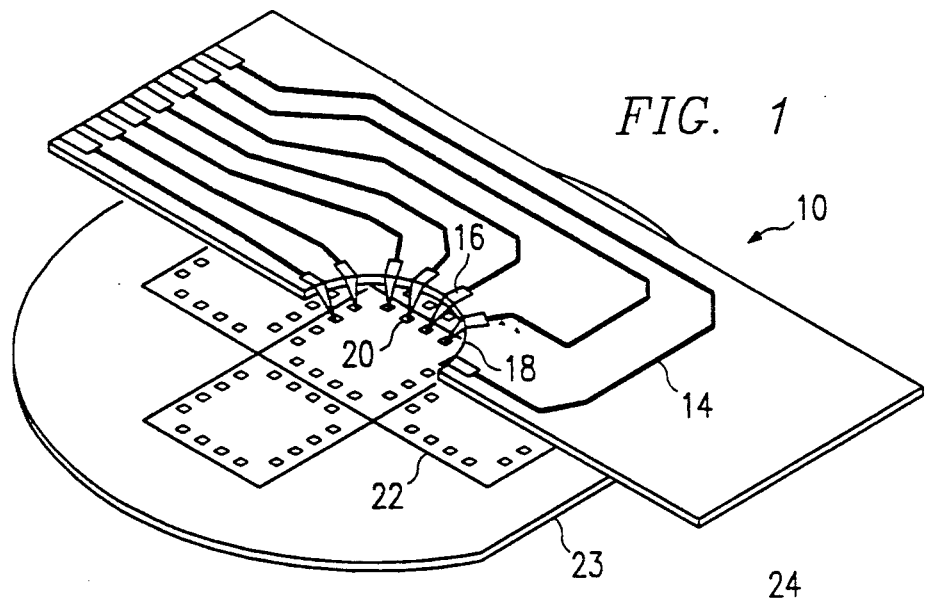
FIG. 1 shows a perspective view of a conventional test probe incorporating a needle and wire bonding configuration.

FIG. 1 provides a cross-sectional schematic perspective view a the conventional test probe engaging integrated circuit test nodes on a semiconductor wafer. Conventional test probe 10 comprises printed wiring board 12 on which wire bondings 14 connect to needles 16. Needles 16 surround opening 18 and penetrate through to positively engaged integrated circuit test nodes 20 on the integrated circuit chips 22. Semiconductor wafer 23 comprises a plurality of integrated circuit chips 22.

Conventional test probe 10 suffers from the limitations that needles 16 must be installed and associated manually around opening 18 to permit contact with chip pads 20 of integrated circuit chip 22. This makes design on conventional test probe 10 extremely expensive. Moreover, the combined length of wire bondings 14 and needles 16 seriously impedes rapid signal communication between the testing circuitry and integrated circuit chips 22. Because needles 16 are bent blades of sharp metal, they are subject to bending and can be shorted together. With increasingly complex integrated circuits, the distance between needles 16 on a conventional test probe 10 becomes smaller and smaller. This increases even further the likelihood of test probe 10 defects and damage with repeated use. Additionally, complexity of test probe 10 in response to increased complexity of integrated circuit chip 22 design requires even more intensive design effort and further adds to the expense of conventional test probe 10. The present invention solves many of these problems and further enhances the use of more sophisticated integrated circuit testing systems.

Figure 2:
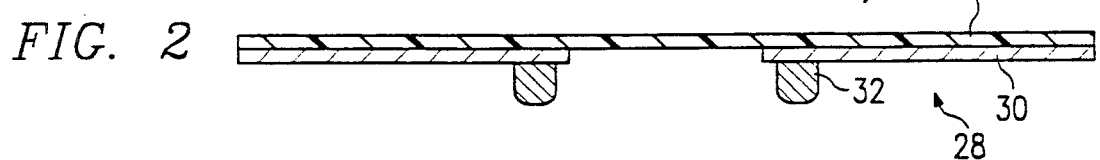
FIG. 2 is a schematic cross-sectional view of the signal platform of a preferred embodiment of the present invention.

FIG. 2 provides a cross-sectional schematic view of signal platform 24 that a preferred embodiment of the present invention incorporates. According to FIG. 2, signal platform 24 comprises tape layer 26 which adheres to interconnection lines 28. Interconnection lines 28, of the preferred embodiment, comprise signal leads 30 which connect to bumps 32.

Tape layer 26 may be a polymer material, for example, the polymer having the brand name "Kapton" manufactured by the Minnesota Mining and Manufacturing Company. In the preferred embodiment, tape layer 26 has at least one side on which signal leads 30 may be patterned. Patterning signal leads 30 may be a lithographic or other process typically used to make tape automated bonding tape. Additionally, tape layer 26 preferably comprises a transparent material that permits alignment of signal leads 30 and bumps 32 with integrated circuit test nodes 20. Signal leads 30 comprise copper or other metallization leads that are lithographically patterned to bring signals from test circuitry to bumps 32. Bumps 32 are preferably gold or copper bumps that are possibly overcoated with some hard material such as tungsten, rhodium, or irridium to assure hard positive contact with the integrated circuit test nodes 20.

Placing interconnection lines 28 on tape layer 26 can be done by the use of known manufacturing techniques such as those used to make tape automated bonding tape. Both signal leads 30 and bumps 32 are applied to tape layer 26 according to the mirror image of the integrated circuit test nodes. Generating the image of interconnection lines 28 with tape automated bonding techniques includes a lithographic process that uses as an input the data base of the integrated circuit to be testing. Using the integrated circuit data base and with the aid of known fabrication computer systems and devices, tape automated bonding techniques can inexpensively generate the necessary bumps 32 and signal leads 30 relative to the integrated circuit test nodes or pads to be tested. Furthermore, where the integrated circuit test nodes themselves include bumps to permit interconnection, signal leads 30 can be designed with pads to receive those bumps.

Figure 3:
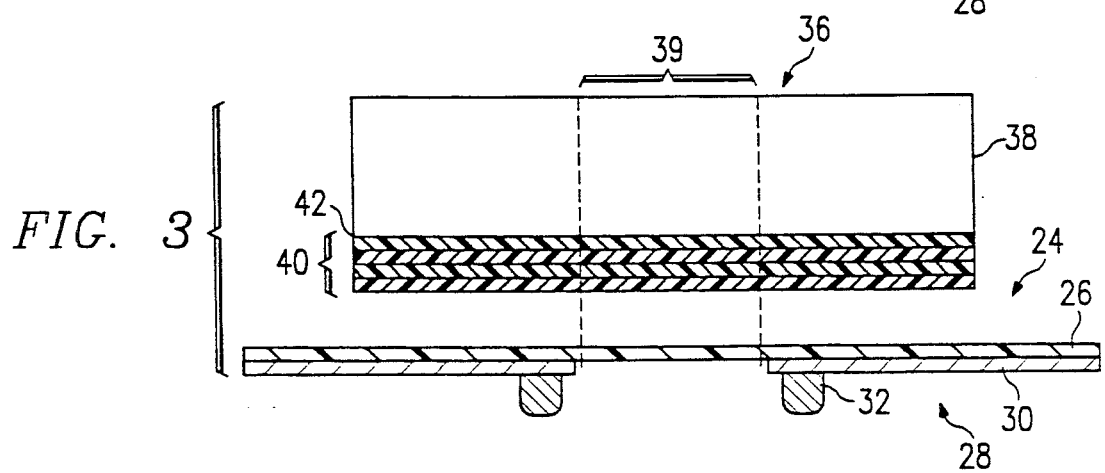
FIG. 3 provides a cross sectional schematic view of a preferred embodiment of the disposable high performance test head of the present invention.

FIG. 3 provides a cross-sectional schematic view of a preferred embodiment of disposable high performance test head 34 of the present invention. Test head 34 comprises pusher block 36 which engages signal platform 24. Pusher block 36 includes rigid force-applying plate 38 which adjoins compliant layer 40 at interface 42. Hole 39 penetrates pusher block 36 and signal platform 24. Pusher block 36 may bond to tape layer 26 of signal platform 24.

Rigid plate 38 of the preferred embodiment comprises a transparent material such as glass or quartz that permits viewing through to compliant layer 40. Compliant layer 40, in the preferred embodiment, comprises a transparent material that allows alignment of the interconnection lines with respective test nodes 20 of the integrated circuit.

Rigid layer 38 permits uniform force distribution and translation for directing bumps 32 downward into integrated circuit test pads 20 for integrated circuit testing. Compliant layer 40 may be a polymer, such as Kapton, to provide the necessary compliance perpendicular to the face of pusher block 36 when pusher block 36 presses against signal platform 24. This assures that interconnection lines 28 physically connect with the integrated circuit test nodes 20 by absorbing planarity differences among integrated circuit test nodes. Assuring positive engagement of interconnection lines 20 promotes electrical connectivity between the integrated circuit test nodes 20 and the test circuitry.

The preferred embodiment of the present invention, furthermore, uses multiple polymer tape layers, such as Kapton tape for inexpensive application of the compliant material layer in the event varying degrees of compliance are necessary for different testing applications. For example, if more compliance than normal is necessary for a particular application, complaint layer 40 may use more polymer tape layers than normal. The compliant material layers may be adhesive on one or both sides to permit attaching one to another as well as to permit establishing an adhesive interface 42 between rigid plate 38 and compliant layer 40.

The combination of interconnection lines 28 adhered to tape layer 26 and transparent pusher block 36 permit maintaining x-y dimensions and alignment of disposable high performance test head 34. The present invention, therefore, avoids the bending and shorting together that needles 16 of conventional test probes 10 experience.

Yet another advantage of greater x-y definition of interconnection lines 28 provided by the disposable high performance test head 34 of the present invention is the ability to probe very large scale integrated circuits on all four sides at one time with minimal alignment. Additionally, since manufacturing techniques for tape automated bonding tape can pattern large areas of tape, it may be useful to use a pattern defined on tape as a substitute for a conventional "bed-of-nails" used for highboard circuits and printed circuit boards. This would permit multiple frames of interconnection lines to be placed in a linear or matrix arrangement to allow probing of multiple devices at one time on a semiconductor wafer.

In the event of a defect or damage to interconnection lines 28 or other portions of signal platform 24, signal platform 24 may be easily removed and a replacement installed with minimal inconvenience or delay in integrated circuit chip testing. Additionally, because the x-y dimensions of integrated circuit test head 34 are defined on signal platform 24, closer tolerances between interconnection lines 28 are possible, thereby allowing probing of devices with many more pins than is easily possible with conventional test probes.

Because the needles or blades of conventional test heads are very tedious to align, attach and to planarize, they tend to be used until integrated circuit chip yield falls off before they are corrected. The disposable high performance test head 34 of the present invention provides for inexpensive replacement of defected or damaged test heads, therefore, replacement will more likely occur upon the initial recognition of damage to test head 34. This, ultimately increases the integrated circuit chip yield.

In the preferred embodiment, an optional hole 39 penetrates pusher block 36 and signal platform 24 to permit engaging needle probes or other electrical connection devices through the disposable high performance test head of the present invention to the integrated circuit. Optional hole 39, thereby, provides an easily accessible path for integrated circuit debugging and failure analysis.

Figure 4:
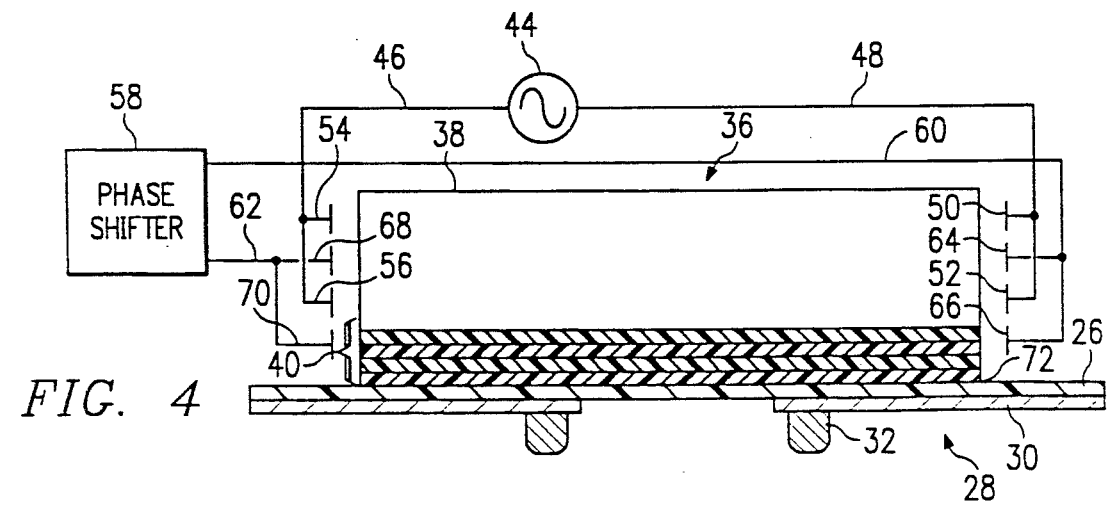
FIG. 4 shows a schematic cross-sectional block diagram of a preferred embodiment of the present invention incorporating a scrubbing system for assuring positive electrical contact between the disposable high performance test probe and integrated circuit test nodes.

FIG. 4 provides a cross-section schematic block diagram of a preferred embodiment of the present invention that incorporates a method of applying a vibrational signal to provide a "scrubbing" action and promote electrical contact between interconnection lines 28 and integrated circuit test nodes 20. According to FIG. 4, signal source 44 sends vibrational signals through lines 46 and 48 to contacts 50, 52, 54 and 56. Phase shifter 58 sends a phase shifted signal through lines 60 and 62 to contacts 64, 66, 68 and 70. Contacts 50 through 56 contact pusher block 36 and provide a vibrating horizontal motion. Pusher block 36 adjoins tape layer 26 by junction 72. This translates horizontal vibrational motion through signal platform 24 causing bumps 32 to scrub integrated circuit test pads 20.

Using a quartz material for rigid plate 38 may permit the use of the material's natural electrical properties to produce a piezoelectric effect. In such event, phase shifter 58 and signal source 44 may operate together to generate a high frequency motion that causes bumps 32 to effectively scrub test nodes 20. Alternatively, a transducer may also be used to cause the desired vibration. Not only may it be desirable to cause horizontal vibration (in the horizontal plane), but also a three-dimensional vibration may be useful for test node 20 scrubbing.

Figure 5:
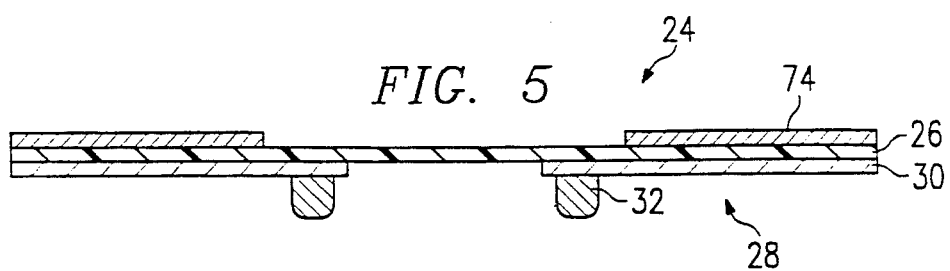
FIG. 5 is a schematic cross-sectional view of a preferred embodiment of the signal platform portion of the present invention incorporating a ground plane for controlling signal impedance.

FIG. 5 shows a cross-sectional schematic view of the present invention including ground plane 74 for establishing a conductive path with interconnection lines 28. According to FIG. 5, signal platform 24 includes ground plane 74 which attaches to tape layer 26. Tape layer 26 adheres to signal leads 30 which attach to bumps 32. By placing ground plane 74 on the back of tape layer 26 the signal traveling within signal lead 30 is decoupled. Also, the combination of the signal lines 30 and ground plane 74 can be configured to provide a constant impedance up to the bumps and thereby improves signal transmission reducing parasitic capacitance and signal distortions. Another possible embodiment of the present invention may include the use of vias that permit communication through tape layer 26. Such vias could by useful for easily interconnecting signal leads 20 to test circuitry, as well as for accommodating space limitations associated with densely packed integrated circuit connections.

Figure 6:
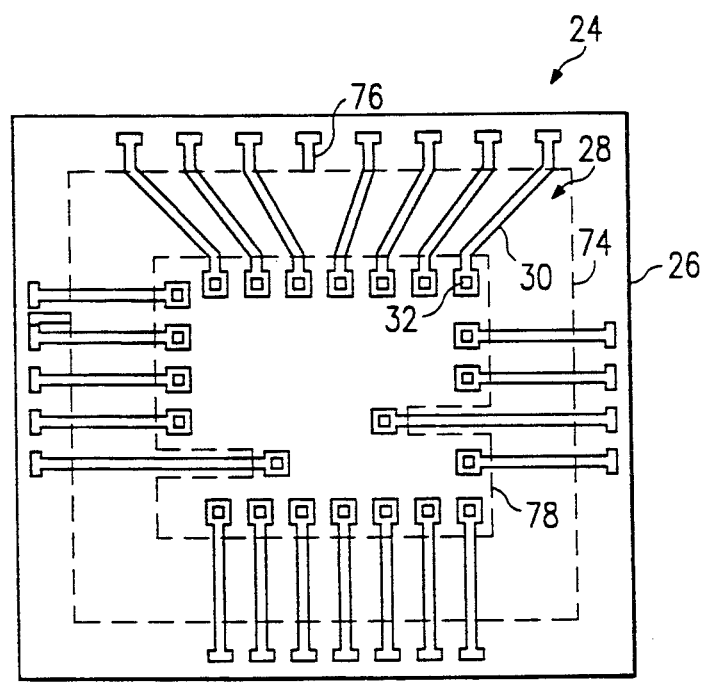
FIG. 6 provides a top planar schematic view of a preferred embodiment of the present invention incorporating a ground plane.

FIG. 6 shows a top planar view of the embodiment of FIG. 5. According to FIG. 6 signal platform 24 comprises tape layer 26 includes on its top signal leads 30 and metal bumps 32. Additionally, ground connector 76 leads to ground plane 74 to provide signal decoupling between interconnection lines 28. Ground plane 74, could also be placed on pusher block 36. Ground plane 74 is cut out to form window 78. Additionally, ground plane 74 may be made smaller than the surface of tape layer 26 to permit viewing interconnection lines 28 for alignment as they engage the integrated circuit test nodes 20.

Figure 7:
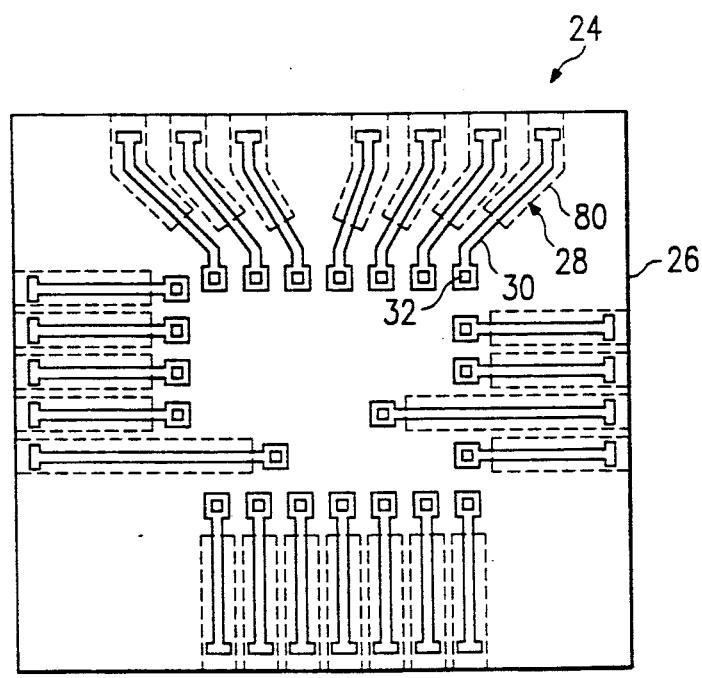
FIG. 7 shows an alternative embodiment of the present invention incorporating a plurality of ground leads associated with respective signal leads for controlling signal impedance.

The ways in which ground plane 74 may be designed to not obstruct the view from pusher block 36 through to interconnection lines 28 are numerous. For example, ground plane 74 could be made a transparent electrically conductive material, for example, tin oxide or indium-tin oxide. Alternatively, as FIG. 7 shows, ground plane 74 may be replaced by ground leads 80 which have a width of approximately three times that of signal leads 30. This configuration of ground leads 80 provides essentially the same decoupling and constant impedance as ground plane 74.

Figure 8:
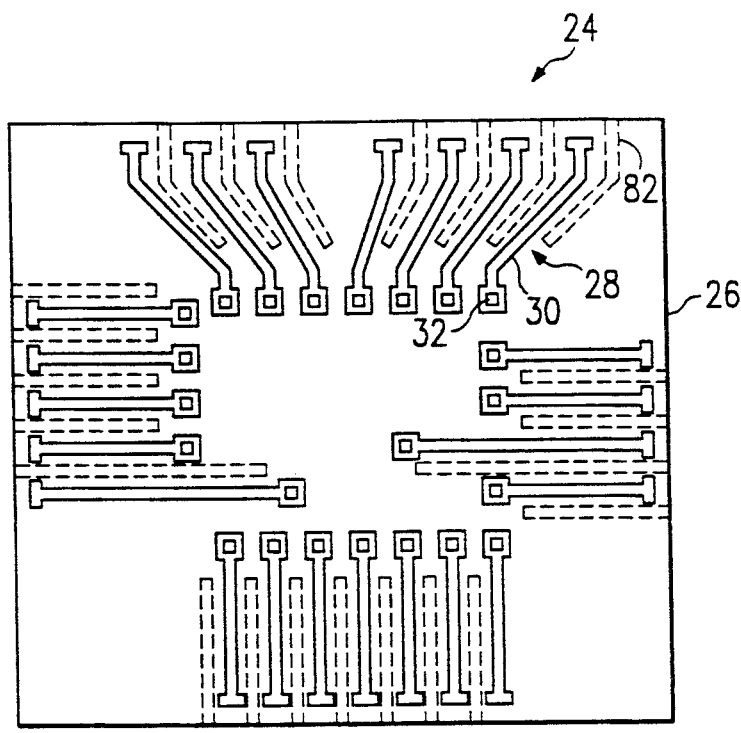
FIG. 8 provides a top planar schematic view of an alternative embodiment of the present invention incorporating alternating ground fingers interspaced and coplanar with signal leads.

FIG. 8 shows yet another embodiment of the present invention in which ground fingers 82 replace ground plane 74 to provide the desired signal decoupling and controlled impedance. The embodiment of FIG. 8, by placing ground fingers 82 between interconnection lines 30, provides the added advantage of significantly reducing or eliminating cross-talk between signal leads 30. Because ground fingers 82 extend no further than signals leads 30 and bumps 32, they also permit viewing integrated circuit test nodes 20 for test hand 34 alignment.

Figure 9:
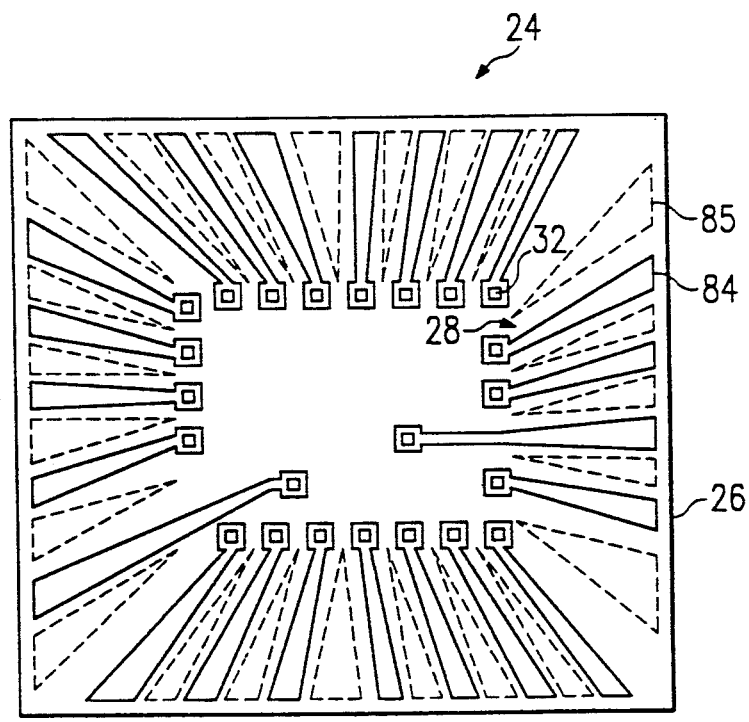
FIG. 9 shows yet another alternative embodiment of the present invention incorporating a plurality of controlled impedance leads for controlling impedance between the integrated circuit test nodes and the test circuitry.

FIG. 9 shows yet another alternative embodiment of the present invention in which tapered leads 84 replace signal leads 30 and tapered ground fingers 85 replace the ground fingers 82 of the FIG. 8 embodiment. The tapered impedance leads 84 and ground fingers 85 produce a constant impedance transmission line that optimizes impedance matching and signal transmission from the test circuitry to integrated circuit test nodes 20. For example, if the test circuitry uses lines having an impedance of 50 ohms, the constant impedance transmission line of this embodiment may be configured to provide a controlled 50 ohm impedance between the test circuitry and the integrated circuit test nodes 20. This permits maximum signal transmission and signal quality between the integrated circuit and the test circuitry.

FIG. 10 shows an alternative embodiment of the present invention in which pusher plate 86 having pusher arms 88 provides a similar downward force to the mechanical force of pusher block 36. According to FIG. 10, pusher plate 86 covers ground plane 90 which both adhere to tape layer 26. Attached further to tape layer 28 are signal leads 30 and metal bumps 32. FIG. 11 shows a top planar schematic view of the alternative embodiment of FIG. 10. According to FIG. 11, pusher plate 86 and tape layer 28 are transparent and of the same planar dimensions. Disposed between pusher plate 86 and tape layer 26 is ground plane 90. Signal leads 30 connect to metal bumps 32.

Pusher plate 86, pusher arms 88 and tape layer 26 permit alignment of interconnection lines 28 with integrated circuit test nodes 20. Instead of the mechanical depression that pusher block 36 of the preferred embodiment provides, pusher arms 88 provide a spring force as test head 34 is pressed to engage integrated circuit test nodes 20. An additional advantage of the spring action of pusher arms 88 may be a slight x-y, or horizontal, movement of bumps 32 as pusher arms 88 move in response to pressure being applied downward on the integrated circuit. This slight x-y movement may be helpful to scrub any oxide layer existing on integrated circuit test nodes 20. Additionally, pusher arms 88 may also absorb planarity differences between test nodes 20.

Arm openings 92 are cut into pusher plate 86 and permit movement of pusher arms 88. The size of openings 92 and pusher arms 88 may vary according to the number of integrated circuit test nodes to which interconnection lines 28 must connect.

In yet another embodiment of the present invention, pusher plate 86 may comprise a plurality of (e.g., four) of separate segments each supporting a separate pusher arm 88. In this configuration, instead of the spring tension of a unitary plate, an external mechanical brace or fitting can provide the necessary spring tension. A particular advantage of this configuration may be the ability to separately remove one of the pusher plate 86 segments in the event of a failure without having to replace other segments which may be operative.

Although the invention has been described with reference to the above specific embodiments, this description is not meant to be construed in a limiting sense. Various modifications of the disclosed embodiment, as well as alternative embodiments of the invention will become apparent to persons skilled in the art upon reference to the above description. It is therefore contemplated that the appended claims will cover such modifications that fall within the true scope of the invention.

What is claimed is:

1. A disposable integrated circuit test head for communicating a plurality of tests signals between test nodes of an integrated circuit and test circuitry, comprising:
   a tape layer;
   a plurality of interconnection lines disposed on said tape layer and operable to communicate test signals between the test nodes and the test circuitry;
   a pusher engaging said tape layer opposite said interconnection lines for applying force through said tape layer to said interconnection lines to provide positive engagement of said interconnection lines with the test nodes, said pusher comprising a rigid force-applying quartz plate and compliant material layer, said compliant material layer disposed between said force-applying plate and said tape layer for absorbing planarity differences as said interconnection lines engage the test nodes; and
   a vibration circuit mechanically coupled to said tape layer, said vibration circuit including a signal source for providing first and second electrical AC signals to first and second sets of contacts respectively on said quartz plate, said first and second AC signals being of a different phase so as to create a piezoelectric effect to produce vibration of said quartz plate for providing a scrubbing action between said interconnection lines and said test nodes.

2. The apparatus of claim 1, wherein said tape layer comprises a transparent material.

3. The apparatus of claim 1, wherein said interconnection lines are lithographically patterned on said tape layer.

4. The apparatus of claim 1 wherein said interconnection lines comprise a plurality of bumps for engaging the integrated circuit test nodes.

5. The apparatus of claim 4 wherein said bumps comprise a hard metallic material for assuring positive electrical connection between said interconnection lines and the integrated circuit test nodes.

6. The apparatus of claim 1 wherein said interconnection lines comprise a plurality of bumps for engaging the integrated circuit test nodes.

7. The apparatus of claim 1, further comprising a ground plane connected to said interconnection lines for providing signal decoupling and impedance control.

8. The apparatus of claim 7, wherein said ground plane comprises a transparent electrically conductive material.

9. The apparatus of claim 1, further comprising a plurality of ground leads, said ground leads are proximate to said interconnection lines for providing signal decoupling and impedance control.

10. The apparatus of claim 9, wherein said interconnection lines comprise a plurality of signal leads and said ground leads are interstitial to said signal leads.

11. The apparatus of claim 10, wherein said signal leads comprise tapered signal leads and said ground leads comprise tapered ground leads for further enhancing signal decoupling and impedance control.

12. The apparatus of claim 1, further comprising an aperture disposed through said tape layer and said pusher for permitting access through said tape layer and said pusher and to the integrated circuit.

13. The apparatus of claim 1, wherein said tape layer comprises a plurality of vias to permit electrical connection therethrough to said interconnection lines.

14. A disposable integrated circuit test head for simultaneously communicating a plurality of test signals between test nodes of a plurality of integrated circuits and test circuitry, comprising:
   a tape layer;
   a plurality of interconnection lines disposed on said tape layer and operable to communicate test signals between the plurality of integrated circuits and the test circuitry;
   a pusher engaging said tape layer opposite said interconnection lines for applying force through said tape layer to said interconnection to provide positive engagement of said interconnection lines with the test nodes, said pusher comprising a rigid force-applying quartz plate and a compliant material layer, said compliant material layer disposed between said force-applying plate and said tape layer for absorbing planarity differences as said interconnection lines engage the test nodes of the plurality of integrated circuits; and
   a vibration circuit mechanically coupled to said tape layer, said vibration circuit including a signal source for providing first and second electrical AC signals to first and second sets of contact respectively on said quartz plate, said first and second AC signals being of a different phase so as to create a piezoelectric effect to produce vibration of said quartz plate for providing a scrubbing action between said interconnection lines and said test nodes.

15. The apparatus of claim 14, wherein said interconnection lines further comprise a plurality of bumps integral thereto for providing electrical contact between said interconnection lines and the test nodes of the plurality of integrated circuits.

16. The apparatus of claim 14, further comprising a ground plane connected to said interconnection lines for providing signal decoupling and impedance control for said interconnection lines.

17. A system for high-performance testing of integrated circuits, comprising:
   test circuitry for generating and receiving a plurality of test signals for testing the integrated circuits:
   a disposable integrated circuit test head for communicating the plurality of test signals between the integrated circuit test nodes and said test circuitry, comprising:
   a tape layer;
   a plurality of interconnection lines adhered to said tape layer and associated to couple with the test nodes to electrically connect the test nodes to the test circuitry for communicating the test signals between the test nodes and the test circuitry;

a pusher block engaging said tape layer opposite said interconnection lines for applying force through said tape layer to said interconnection lines to provide positive engagement of said interconnection lines with the test nodes, said pusher block comprising a rigid force applying quartz plate and a compliant material layer, said compliant material layer position between said force applying plate and said tape layer for absorbing planarity differences as said interconnection lines engage the test nodes; and a vibration circuit mechanically coupled to said tape layer, said vibration circuit including a signal source for providing first and second electrical AC signals to first and second sets of contact respectively on said quartz plate, said first and second AC signals being of a different phase so as to create a piezoelectric effect to produce vibration of said quartz plate for providing a scrubbing action between said interconnection lines and said test nodes.

* * * * *